(12) United States Patent
La Rosa (10) Patent No.: US 9,091,713 B2
(45) Date of Patent: Jul. 28, 2015

(54) METHOD AND DEVICE FOR CHARACTERIZING OR MEASURING A CAPACITANCE

(71) Applicant: STMicroelectronics (Rousset) SAS, Rousset (FR)

(72) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 269 days.

(21) Appl. No.: 13/669,732

(22) Filed: Nov. 6, 2012

(65) Prior Publication Data

US 2013/0057298 A1 Mar. 7, 2013

Related U.S. Application Data

(63) Continuation-in-part of application No. PCT/FR2011/050578, filed on Mar. 21, 2011.

(30) Foreign Application Priority Data

| | | |
|---|---|---|
| May 7, 2010 | (FR) | 10 01964 |
| May 7, 2010 | (FR) | 10 01966 |

(51) Int. Cl.
*G01R 27/02* (2006.01)
*G01R 27/26* (2006.01)
*G06F 3/041* (2006.01)
*G06F 3/044* (2006.01)

(52) U.S. Cl.
CPC ............ *G01R 27/2605* (2013.01); *G06F 3/044* (2013.01); *G06F 3/0416* (2013.01)

(58) Field of Classification Search
None
See application file for complete search history.

(56) References Cited

U.S. PATENT DOCUMENTS

| | | | | |
|---|---|---|---|---|
| 4,208,625 | A * | 6/1980 | Piso | 324/671 |
| 7,595,648 | B2 * | 9/2009 | Ungaretti et al. | 324/678 |
| 2001/0033177 | A1 | 10/2001 | Lindolf et al. | |
| 2003/0218473 | A1 | 11/2003 | Yamashita et al. | |
| 2008/0150551 | A1 | 6/2008 | Kim | |
| 2013/0063157 | A1 * | 3/2013 | La Rosa | 324/610 |

* cited by examiner

*Primary Examiner* — Minh N Tang
(74) *Attorney, Agent, or Firm* — Seed IP Law Group PLLC (57) ABSTRACT

A method for characterizing or measuring a capacitance includes linking the capacitance to a first mid-point of a first capacitive divider bridge, applying to the divider bridge a bias voltage, maintaining the voltage of the first mid-point near a reference voltage, discharging a second mid-point of a second divider bridge in parallel with the first using a constant current, and measuring the time for a voltage of the second mid-point to become equal to the voltage of the first mid-point. The method may be applied in particular to the control of a touch screen display.

21 Claims, 5 Drawing Sheets

METHOD AND DEVICE FOR CHARACTERIZING OR MEASURING A CAPACITANCE

BACKGROUND

1. Technical Field

The present disclosure relates to a method and a device for characterizing or measuring a capacitance. The present also relates to a method and a device for characterizing or measuring a floating capacitance.

The present disclosure relates in particular but not exclusively to the characterization or measurement of capacitances in a touch screen display.

2. Description of the Related Art

Various methods for characterizing or measuring capacitances are known, such as charge transfer methods, time constant measurement methods, oscillator relaxation methods, charging current measurement methods, methods using a sigma-delta modulator and sine wave measurement methods. These methods will be briefly summed up.

Charge Transfer

Charges are transferred from a precharged reference capacitance to a capacitance to be measured. The operation is repeated several times with calibrated charge quantities until reaching a determined voltage. The number of charge transfers to obtain this voltage is representative of the capacitance to be measured.

Time Constant Measurement

A resistor of known value R is connected in series with the capacitance C to be measured. A switch is put in parallel with the capacitance. The capacitance is charged and is then discharged using the switch. An amplifier copies the decrease curve of the voltage at the terminals of the capacitance. The time constant RC corresponding to the decrease curve of the voltage is determined, to deduce the capacitance C therefrom.

Oscillator Relaxation

A current generator is put in series with the capacitance to be measured. A transistor is put in parallel with the capacitance. The voltage at the terminals of the capacitance is sent to the positive input of an operational amplifier which negative input receives a reference voltage. The output of the amplifier controls the transistor. The set forms an oscillator which frequency F is a function of the capacitance C. Measuring the frequency allows the capacitance to be determined.

Measurement of a Charge Current

A constant charge current I is injected into the capacitance C to be measured. After a determined time T, a charge Q is accumulated by the capacitance C and the voltage at the terminals of the capacitance goes from an initial voltage Va to a voltage Vb. By applying the relationships $Q=C*V$ and $Q=I*T$, the capacitance C which is equal to $I*T/(Vb-Va)$ is deduced.

Measurement with a Sigma-Delta Modulator

An alternating voltage is applied to the terminals of the capacitance C to be measured. The voltage at the terminals of the capacitance is digitized by a sigma-delta modulator and the value thereof is representative of the capacitance.

Sine Wave Measurement

A resistor R is put in series with the capacitance C to be measured. An alternating signal is applied to the set. The voltage at the terminals of the resistor is measured with a differential analog-to-digital converter, to deduce the capacitance C.

Some known methods are penalized by a quite long acquisition time of the parameter allowing a capacitance to be characterized or measured. Others are penalized by the complexity of the means used for their implementation. Applications such as the control of a touch screen display require a rapid scan time of a matrix of capacitances, to determine the variations of its capacitances and detect the actions of the user.

BRIEF SUMMARY

The present disclosure relates to a method for characterizing or measuring a capacitance which is an alternative to known methods and has advantages in terms of implementation simplicity, rapidity of characterization or measurement data acquisition, and measurement precision.

A first aspect of the disclosure relates to the measurement of a capacitance having a terminal connected to the ground.

A second aspect of the disclosure relates to the measurement of a floating capacitance, which both terminals are not connected to the ground.

The second aspect of the disclosure relates in particular to the measurement of a floating capacitance having at least one terminal ed to the ground through a parasitic capacitance.

Embodiments of the disclosure relate to a method for characterizing or measuring a capacitance, comprising: providing a first capacitive voltage divider bridge and a second capacitive voltage divider bridge in parallel with the first, the first divider bridge comprising a first mid-point having a first voltage and the second divider bridge comprising a second mid-point having a second voltage; linking the capacitance to the first mid-point; applying to the divider bridges a bias voltage; maintaining the first voltage near a reference voltage; discharging the second mid-point with a constant current; and measuring a first time for the second voltage to reach a determined value.

In one embodiment, the first time is the time for the second voltage to become equal to the first voltage.

In one embodiment, the method comprises an offset measurement phase comprising: not linking the capacitance to the first mid-point, applying to the divider bridges the bias voltage, maintaining the first voltage near the reference voltage, discharging the second mid-point with a constant current, and measuring a second time for the second voltage to become equal to the first voltage.

In one embodiment, the method comprises a step of calculating the difference between the first and the second times, as characterization or measurement parameter of the first capacitance.

In one embodiment, the method comprises a calibration phase comprising: linking a calibration capacitance to the first mid-point; applying to the divider bridges the bias voltage; maintaining the first voltage near the reference voltage; discharging the second mid-point with a constant current; and measuring a third time for the second voltage to become equal to the first voltage.

In one embodiment, the method comprises a step of calculating the capacitance comprising the calculation of the product of the calibration capacitance and the ratio of the difference between the first and the second times and the difference between the third and the second times.

In one embodiment, measuring a time consists in counting a number of cycles of a clock signal.

Embodiments of the disclosure also relate to a device for characterizing or measuring a capacitance, the device comprising: a first capacitive voltage divider bridge and a second capacitive voltage divider bridge in parallel with the first, a first mid-point of the first divider bridge, having a first voltage and a second mid-point of the second divider bridge, having a second voltage; means for linking the capacitance to the first mid-point; means for applying to the divider bridges a bias voltage and maintaining the first voltage near a reference voltage; means for discharging the second mid-point with a constant current; and means for measuring a first time for the second voltage to reach a determined value.

In one embodiment, the first time is the time for the second voltage to become equal to the first voltage.

In one embodiment, the device is configured to execute an offset measurement phase comprising: not linking the capacitance to the first mid-point; applying to the divider bridges the bias voltage; maintaining the first voltage near the reference voltage; discharging the second mid-point with a constant current; and measuring a second time for the second voltage to become equal to the first voltage.

In one embodiment, the device is configured to execute a calibration phase comprising: linking a calibration capacitance to the first mid-point; applying to the divider bridges the bias voltage; maintaining the first voltage near the reference voltage; discharging the second mid-point with a constant current; and measuring a third time for the second voltage to become equal to the first voltage.

In one embodiment, the device is configured to determine the capacitance by calculating the product of the calibration capacitance and the ratio of the difference between the first and the second times and the difference between the third and the second times.

In one embodiment, the device is configured to execute an offset measurement phase followed by several phases for characterizing or measuring several capacitances.

In one embodiment, the means for maintaining the voltage of the first mid-point near the reference voltage comprise a feedback loop comprising a means for comparing the first voltage to the reference voltage.

In one embodiment, the means for measuring a time comprise means for counting a number of cycles of a clock signal.

BRIEF DESCRIPTION OF THE SEVERAL VIEWS OF THE DRAWINGS

Embodiments of the method and device for characterizing and measuring a capacitance according to the disclosure will be described below in relation with, but not limited to the appended figures wherein.

DETAILED DESCRIPTION

To clarify language and figures, the term "capacitance" will be used in the present application to equally refer to a capacitor or the electrical capacitance thereof. In particular, the term "parasitic capacitance" is usually used to refer to a parasitic component having a determined capacitance. The result is that the term "capacitance" has also been used to refer both to components of "capacitor" type and components of "parasitic capacitance" type. Those skilled in the art will be able, according to the context of the sentence, to determine if the term "capacitance" is used to refer to a component or to refer to the electrical capacitance thereof, or both. The term "characterization" of a capacitance, refers hereinafter to an operation consisting in determining a parameter representative of the value of a capacitance. Such a characterization parameter may be insufficient to determine the precise value of the capacitance but it allows at least the variations thereof to be determined. Globally, embodiments of the which will be described hereinafter relate to the acquisition of data allowing at least capacitances to be characterized, otherwise measured. If these embodiments are implemented only to supply insufficient characterization data to directly calculate these capacitances, it does not necessarily means that no measure of these capacitances may be taken by means of the characterization data. Methods of software post-processing may indeed be provided to perform processing the characterization data and deduce therefrom capacitance values.

In addition, it will be noted that some applications, such as the management of a capacitive touch screen display, do not require precisely knowing the value of a capacitance and only require determining the variations thereof. Such variations are representative of an event to detect, for example the fact that a user places the finger in a particular location of the capacitive touch screen, which causes a variation of the capacitance or capacitances present at this location. The detection of these variations may be sufficient for the detection of the actions of the user.

The following description relates to two embodiments of the disclosure. The first embodiment of the disclosure characterizes or measures a capacitance having a terminal linked to the ground. The second embodiment of the disclosure characterizes or measures a floating capacitance. The second embodiment of the disclosure relates in particular to the case where at least the capacitance terminal from which this capacitance is characterized or measured, is linked to the ground through a parasitic capacitance.

First Aspect of the Disclosure

Figure 1:
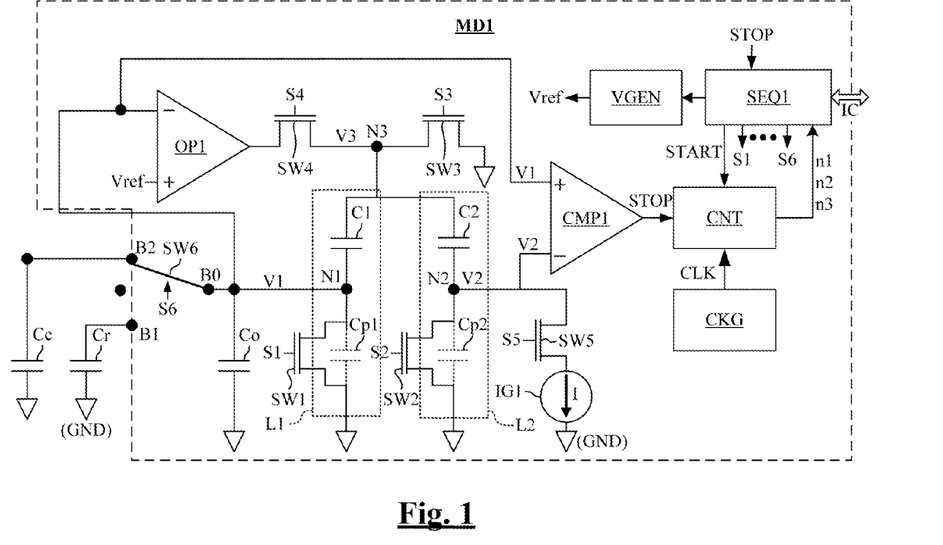
FIG. 1 shows a device for characterizing or measuring a capacitance according to a first aspect of the disclosure.

FIG. 1 shows an example embodiment of a device MD1 for characterizing or measuring a capacitance according to the disclosure. The device MD1 may in practice be made in the form of integrated circuit on semiconductor substrate. The device MD1 comprises:

two capacitive divider bridges L1, L2 in parallel,
an offset capacitance Co,
switches SW1, SW2, SW3, SW4, SW5, SW6,
an operational amplifier OP1,
a comparator CMP1,
a current generator IG1,
a voltage generator VGEN,
a clock signal CLK generator CKG,
a counter CNT, and
a wired-logic or microprocessor sequencer SEQ1.

The divider bridge L1 comprises capacitances C1, Cp1 in series and the divider bridge L2 comprises capacitances C2, Cp2 in series. The capacitance C1 has a negative terminal linked to a node N1 and a positive terminal linked to a node N3. The capacitance C2 has a negative terminal linked to a node N2 and a positive terminal linked to a node N3. The capacitance Cp1 has a positive terminal linked to the node N1 and a negative terminal linked to the ground. The capacitance Cp2 has a positive terminal linked to the node N2 and a negative terminal linked to the ground. In one embodiment, the capacitances Cp1, Cp2 are parasitic capacitances of integrated circuit on semiconductor substrate. They may for example be drain-substrate capacitances of MOS transistors used to make the switches SW1 and SW2.

The nodes N1, N2 form the respective mid-points of the divider bridges L1, L2 and have voltages V1, V2. The node N3 has a voltage V3. The offset capacitance Co is connected between the node N1 and the ground.

The sequencer SEQ1 is equipped with a communication interface IC allowing it to transmit characterization or measurement data to an external device. In one embodiment of the device, the switches SW1-SW5 are made from MOS transistors. The switches SW1-SW5 are switches with two terminals having an ON state and an OFF state. The switch SW6 is a switch with three terminals B0, B1, B2 having a state "ON1" in which the terminal B0 is linked to the terminal B1, a state "ON2" in which the terminal B0 is linked to the terminal B2, and a state OFF in which the terminals B0, B1, B2 are not electrically linked. The switch is schematically shown in FIG. 1 to simplify the figure. In one embodiment, the switch SW6 is made from several MOS transistors, in a way known from those skilled in the art.

The terminal B0 of the switch SW6 is connected to the node N1 of the divider bridge L1. The terminal B1 is linked to a reference capacitance Cr which other terminal is connected to the ground. The terminal B2 is linked to a terminal of a capacitance Cc which must be characterized or measured, the other terminal of which is connected to the ground. It is assumed that the ground of the capacitances Cr, Cc is at the same electric potential as the ground of the device MD1. It may for example be the earth potential, or the ground of a device including the device MD1 and the capacitances Cr, Cc.

The node N1 of the divider bridge L1 is linked to the ground through the switch SW1. The node N2 of the divider bridge L2 is linked to the ground through the switch SW2. The node N3 is linked to the ground through the switch SW3. The node N2 is also linked to the ground through the switch SW5 and the current generator IG1.

The amplifier OP1 has a negative input linked to the node N1 and a positive input receiving a reference voltage Vref, for example a bandgap voltage supplied by the voltage generator VGEN. The output of the operational amplifier OP1 is linked to the node N3 through the switch SW4.

The comparator CMP1 receives the voltage V1 on a positive input and the voltage V2 on a negative input. The output thereof supplies a signal STOP to the counter CNT. The signal STOP is also sent to the sequencer so that it is informed of the end of a measurement step described below. The sequencer supplies control signals S1, S2, S3, S4, S5, S6 for controlling switches SW1 to SW6, as well as a signal START applied to the counter CNT. The counter CNT receives the clock signal CLK on a counting input and performs counting the cycles of the clock signal.

Implementation of the Method

In one embodiment, the method for characterizing or measuring a capacitance according to the disclosure comprises three phases:
1) a phase Pcm1 for measuring the offset,
2) a calibration phase Pcm2 by means of the capacitance Cr,
3) a phase Pcm3 for characterizing or measuring the capacitance Cc.

Each of these three phases comprises a precharge step P1, a step P2 for measuring an electric charge, and a step P3 for resetting the device.

The following Table 2 sums-up the states of the switches SW1-SW6 during the different steps of these various phases.

TABLE 2

| Phase | Step | SW1 | SW2 | SW3 | SW4 | SW5 | SW6 |
|-------|------|-----|-----|-----|-----|-----|-----|
| Pcm1 | P1 | OFF | OFF | OFF | ON | OFF | OFF |
|  | P2 | OFF | OFF | OFF | ON | ON | OFF |
|  | P3 | ON | ON | ON | OFF | OFF | ON1 |
| Pcm2 | P1 | OFF | OFF | OFF | ON | OFF | ON1 |
|  | P2 | OFF | OFF | OFF | ON | ON | ON1/OFF |
|  | P3 | ON | ON | ON | OFF | OFF | ON1-ON2 |
| Pcm3 | P1 | OFF | OFF | OFF | ON | OFF | ON2 |
|  | P2 | OFF | OFF | OFF | ON | ON | ON2/OFF |
|  | P3 | ON | ON | ON | OFF | OFF | ON2 |

Figure 2A:
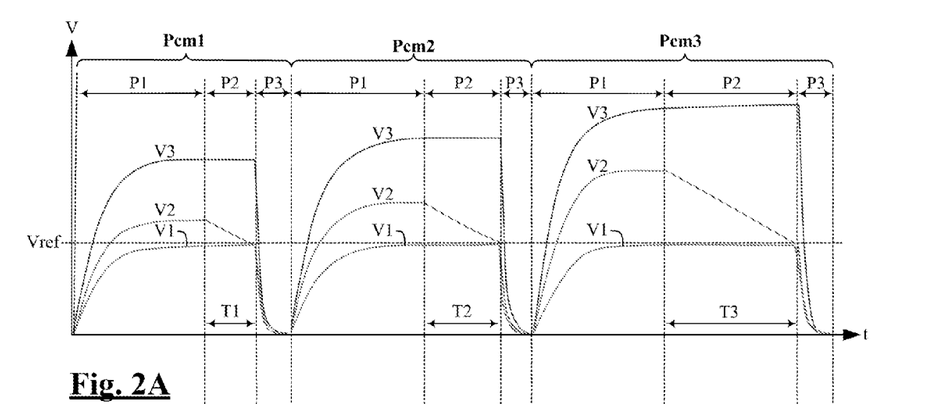
FIGS. 2A, 2B show electrical signals appearing in the device of FIG. 1 according to a first embodiment of a first method according to the disclosure.
Figure 2B:
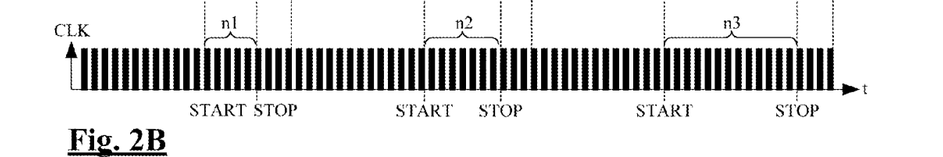

FIG. 2A shows the curves of the voltages V1, V2 and V3 during each of the phases Pcm1, Pcm2, Pcm3. FIG. 2B shows the clock signal CLK supplied by the generator CKG as well as counting values n1, n2, n3 supplied by the counter CNT.

1) Offset Measurement Phase Pcm1 i) Precharge Step P1

This step starts after resetting the capacitances C1, C2, Cp1, Cp2, Co by means of a reset step described below. The sequencer SEQ1 places the switches SW1, SW2, SW3, SW5, SW6 in the state OFF and the switch SW4 in the state ON. The output of the amplifier OP1 controls the voltage V3 of the node N3 through the switch SW4, the voltage V3 being a function of the difference between the voltage Vref and the voltage V1. Thus, the voltage V1 of the node N1 tends to the voltage Vref, by feedback effect.

At the end of the precharge phase, the voltage V2 at the node N2 reaches a value V2(1) which differs from the voltage V1. It is assumed here that the voltage V2(1) is higher than the voltage V1. Indeed, the voltage V2 is equal to V3*C2/(Cp2+C2) and the voltage V1 is equal to V3*C1/(Cp1+Co+C1). The condition:

$$V2 > V1 \quad (a)$$

implies that:

$$V3*C2/(Cp2+C2) > V3*C1/(Cp1+Co+C1) \quad (b)$$

i.e.:

$$C2/(Cp2+C2) > C1/(Cp1+Co+C1) \quad (d)$$

If C1=C2 and Cp1=Cp2, the relationship becomes:

$$Co > 0 \quad (e)$$

Thus, the condition V2>V1 is verified if the capacitance Co is not equal to zero.

ii) Measurement Step P2

The aim of this step is to measure an electric charge Q1 for balancing the voltages V1 and V2. This electrical charge is measured indirectly, by measuring the time to balance these voltages with the constant current I supplied by the generator IG1. This time is indirectly measured, by measuring a number of cycles of the clock signal.

To start the measurement step, the sequencer SEQ1 places the switch SW5 in the state ON, does not modify the state of the other switches and applies the signal START to the counter CNT. The node N2 is discharged by the current I and the voltage V2 decreases, while the voltage V1 keeps being maintained near Vref by the amplifier OP1.

The measurement step ends when the voltage V2 becomes equal to the voltage V1 and starts becoming lower than the voltage V1. The signal STOP at the output of the comparator CMP1 goes to 1 and stops the counter CNT. The latter supplies a counting value n1 which is proportional to the duration T1 of the measurement step, such as T1=K*n1, where K is the period of the clock signal. The parameter n1 is memorized by the sequencer.

iii) Reset Step

The sequencer places the switches SW1, SW2, SW3 in the state ON and the other switches in the state OFF. The capacitances C1, C2, Cp1, Cp2, Co are discharged. The switch SW6 is also placed in the state ON1 to guarantee that the capacitance Cr is discharged, to prepare the phase Pcm2.

2) Calibration Phase Pcm2 i) Precharge Step P1

The sequencer SEQ1 places the switches SW1, SW2, SW3, SW5 in the state OFF, the switch SW4 in the state ON and the switch SW6 in the state ON1. The terminal B1 is linked to the terminal B0 and the reference capacitance Cr is put in parallel with the offset capacitance Co. The two capacitances form an equivalent capacitance equal to Cr+Co.

The output of the amplifier OP1 controls the voltage V3 of the node N3 through the switch SW4 and the voltage V1 of the node N1 tends to the voltage Vref, by feedback effect.

At the end of the precharge phase, the voltage V2 at the node N2 reaches a value V2(2) higher than the voltage V1. If C1=C2 and Cp1=Cp2, it implies that the equivalent capacitance Cr+Co is not equal to zero, as demonstrated above.

ii) Measurement Step P2

The aim of this step is to measure an electric charge Q2 for balancing the voltages V1 and V2.

The sequencer SEQ1 places the switch SW5 in the state ON, does not modify the state of the other switches and applies the signal START to the counter CNT. Alternately, the switch SW6 may be placed back in the state OFF without it affecting the measurement step P2, because the node N1 is already precharged and the voltage V1 remains stable during the step P2 thanks to the feedback via the amplifier OP1. Opening the switch SW6 allows on the contrary the device to be protected against a possible variation of the capacitance Cr during the step P2, or against a voltage disturbance at the terminals of the capacitance Cr due to an external cause.

The node N2 is discharged by the current I and the voltage V2 decreases. The measurement step ends when the voltage V2 becomes equal to the voltage V1 and starts becoming lower than the voltage V1. The signal STOP stops the counter CNT. The latter supplies a counting value n2 which is proportional to the duration T2 of the measurement step. The parameter n2 is memorized by the sequencer.

iii) Reset Step

As previously, the sequencer places the switches SW1, SW2, SW3 in the state ON and the other switches in the state OFF. The switch SW6 is preferably placed successively in the states ON1, ON2 to discharge the capacitance Cr, and guarantee that the capacitance Cc is also discharged to prepare the phase Pcm3.

3) Characterization or Measurement Phase Pcm3 i) Precharge Step P1

The sequencer SEQ1 places the switches SW1, SW2, SW3, SW5 in the state OFF, the switch SW4 in the state ON and the switch SW6 in the state ON2. The terminal B2 is linked to the terminal B0 and the external capacitance Cc is put in parallel with the offset capacitance Co. The two capacitances form an equivalent capacitance equal to Cc+Co.

The output of the amplifier OP1 controls the voltage V3 of the node N3 through the switch SW4 and the voltage V1 of the node N1 tends to the voltage Vref, by feedback effect.

At the end of the precharge phase, the voltage V2 at the node N2 reaches a value V2(3) higher than the voltage V1. If C1=C2 and Cp1=Cp2, it implies that the equivalent capacitance Cc+Co is not equal to zero, as demonstrated above.

ii) Measurement Step P2

The aim of this step is to measure an electric charge Q3 for balancing the voltages V1 and V2.

The sequencer SEQ1 places the switch SW5 in the state ON, does not modify the state of the other switches and applies the signal START to the counter CNT. Alternately, the switch SW6 may be replaced in the state OFF to protect the device against a possible variation of the capacitance Cc during the step P2, or against a voltage disturbance at the terminals of the capacitance Cc due to an external cause.

The node N2 is discharged by the current I and the voltage V2 decreases. The measurement step ends when the voltage V2 becomes equal to the voltage V1 and starts becoming lower than the voltage V1. The signal STOP goes to 1 and stops the counter CNT. The latter supplies a counting value n3 which is proportional to the duration T3 of the measurement step. The parameter n3 is memorized by the sequencer.

iii) Reset Step

As previously, the sequencer places the switches SW1, SW2, SW3 in the state ON and the other switches in the state OFF. The switch SW6 is let in the state ON2 to discharge the capacitance Cc.

Using the Characterization or Measurement Data

Here, the hypothesis is made that the divider bridges L1, L2 are intrinsically balanced and that the unbalance between the two bridges comes from:

during the offset measurement phase Pcm1, the electric charge stored in the offset capacitance Co, during the calibration phase Pcm2, the electric charge stored in the capacitances Cr and Co, of equivalent capacitance Cr+Co, and during the phase Pcm3, the electric charge stored in the capacitances Cc and Co, of equivalent capacitance Cc+Co.

Indeed, the capacitances C1, C2 and Cp1, Cp2 may in practice differ but the electrical diagram of the divider bridges L1, L2 may be brought to an equivalent diagram in which C1=C2 and Cp1=Cp2 and in which the unbalance between the two divider bridges is considered as being caused:

by the capacitance Co when the capacitances Cr and Cc are not connected to the node N1, by the capacitances Co and Cr when the capacitance Co is connected to the node N1, or by the capacitances Co and Cc when the capacitance Cc is connected to the node N1.

The diagram of FIG. 1 therefore applies to various embodiments of the divider bridges L1, L2, including those where the capacitances C1, C2 are not equal, as well as the capacitances Cp1, Cp2, and/or when each capacitance consists of various capacitances in parallel and/or in series.

It is also considered here that the current I which has been extracted from the node N2 during the times T1, T2, T3 during measurement steps P2, until obtaining the balance of the voltages V1, V2, is representative of the electric charge Q1, Q2 or Q3 stored in the capacitance at the origin of the unbalance, i.e., Co, Cr+Co or Cc+Co.

It may therefore be written, regarding the phase Pcm1:

$$Q1 = Co*V1 = I*T1 \tag{1}$$

It may also be written, regarding the phase Pcm2:

$$Q2 = V1 = I*T2 \tag{2}$$

i.e.:

$$Q2 = Cr*V1 + Co*V1 = I*T2 \tag{3}$$

i.e., by combining and:

$$Q2 = Cr*V1 + I*T1 = I*T2 \tag{4}$$

i.e.:

$$Cr = I(T2-T1)/V1 \quad (5)$$

It may also be written, regarding the phase Pcm3:

$$Q3 = *V1 = I*T3 \quad (6)$$

i.e.:

$$Q3 = Cc*V1 + Co*V1 = I*T3 \quad (7)$$

i.e., by combining and:

$$Q3 = Cc*V1 + I*T1 = I*T3 \quad (7)$$

i.e.:

$$Cc = I(T3-T1)/V1 \quad (9)$$

By combining and:

$$Cc/Cr = [I(T3-T1)/V1]/[I(T2-T1)/V1] \quad (10)$$

i.e.:

$$Cc = Cr/(T2-T1) \quad (11)$$

The times T1, T2, T3 being proportional to the counting parameters n1, n2, n3, the relationship may also be written:

$$Cc = Cr/(n2-n1) \quad (12)$$

The parameters n1, n2, n3 therefore allow the capacitance Cc to be calculated if the capacitance Cr is known. In addition to the fact that it offers a rapid acquisition time of these characterization parameters, the method according to the disclosure has the advantage that the characterization or measurement of the capacitance Cc as a function of the reference capacitance Cr does not depend on the possible drifts of the voltage Vref, the current I or the oscillator frequency, as a function of the integrated circuit. That results from the relationship which only depends on Cr, assuming that the parameters n1, n2, n3 are measured at close times.

However, as indicated above, a characterization of a capacitance without measuring it may be sufficient in some applications. The variations of the time T3, i.e., the variations of n3, allow for example the variations of the capacitance Cc to be determined without it being necessary to acquire the parameters n1 and n2. For example, two successive values Cca and Ccb of the capacitance Cc are considered. Each value Cca and Ccb corresponds to different times T3a, T3b for the balancing of the divider bridges during the phase Pcm3, corresponding to counting parameters n3a, n3b. By applying the relationship, it may be written:

$$Cca = Cr/(n2-n1) \quad (13)$$

$$Ccb = Cr/(n2-n1) \quad $$

By combining and:

$$Ccb - Cca = Cr/(n2-n1)$$

i.e.:

$$Ccb - Cca = K' \quad (16)$$

i.e.:

$$Ccb = Cca + K' \quad (17)$$

where K' is a constant equal to $Cr/(n2-n1)$.

The variations of the capacitance Cc therefore result in variations of the counting parameter n3.

Figure 3A:
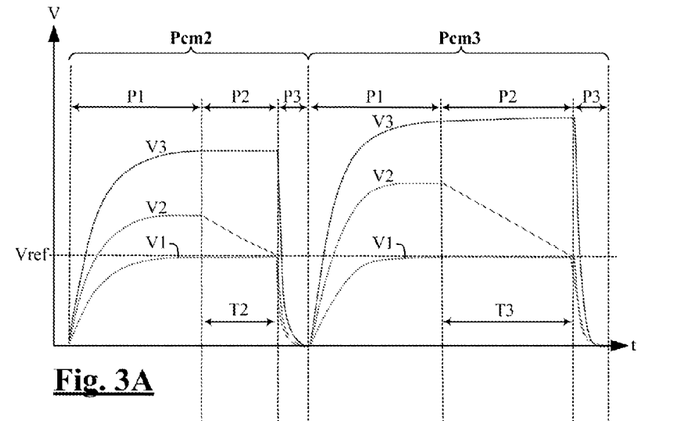
FIGS. 3A, 3B show electrical signals appearing in the device of FIG. 1 according to a second embodiment of the first method.
Figure 3B:
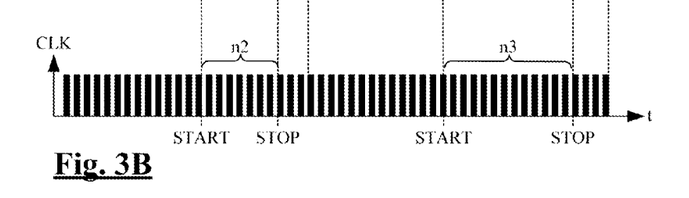

Another embodiment of the method of the disclosure only comprises the phases Pcm2 and Pcm3 without the phase Pcm1, as shown in FIGS. 3A and 3B. The offset measurement phase Pcm1 is therefore not executed. For example, the phase Pcm1 is not executed when the divider bridge is, by its design, substantially balanced or when the capacitance Co is low in relation to the capacitance Cc. In that case, the offset measurement parameter n1 is low in relation to n2 and n3 and the relationship may simplify as follows:

$$Cc = Cr \quad (18)$$

In another embodiment of the method of the disclosure, the phases Pcm1 and Pcm2 are not executed. The counting data n3 are first memorized at a time t0 corresponding to a known initial value Cc0 of the capacitance Cc, or a hypothesis on the value thereof. From the time t0, the variations of the capacitance Cc are determined by means of a program and the relationship and from the initial value Cc0. Such a program may be executed by the sequencer SEQ1 or by an external calculator to which the sequencer SEQ1 supplies the counting data n3.

In practice, the device MD1 may be used to characterize or measure a plurality of external capacitances $Cc_{i,j}$, in particular in a tactile capacitance matrix, where "i,j" are indexes of lines and columns of the matrix capacitances. In that case, the switch SW6 is replaced by a series of switches in parallel $SW6_{i,j}$ which are placed one after the others in the state ON2 by the sequencer SEQ1 and supply counting values $n3_{i,j}$ corresponding to each of the capacitances $Cc_{i,j}$. Alternately, several devices MD1 may be provided, each being connected to a line or a column of the matrix of capacitances.

In the event of a drift of I and/or Vref and/or the oscillator frequency over time, the parameter n2 may be refreshed from time to time, so that it is measured with the same current I, the same voltage Vref and the same frequency as the parameter n3. It is therefore not necessary to acquire the parameter n2 at each new acquisition of the parameter n3. Thus, in one embodiment, the method according to the disclosure comprises a phase Pcm2 followed by a plurality of phases Pcm3 which aim is to measure the variations of the external capacitance Cc or the plurality of external capacitances $Cc_{i,j}$. It may also comprise a phase Pcm1 followed by a phase Pcm2, which is followed by a plurality of phases Pcm3.

Application to the Measurement of a Floating Capacitance

Figure 4:
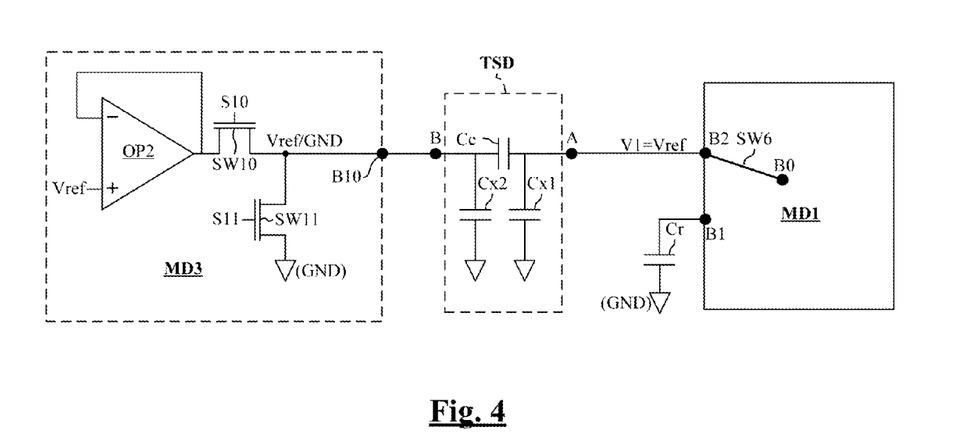
FIG. 4 shows a particular example implementation of the device of FIG. 1 according to a third embodiment of the first method.

FIG. 4 shows a particular example of application of the device MD1. The aim is here to measure the capacitance Cc in the following conditions:

when it is arranged in a floating way and when the terminals thereof are linked to the ground through parasitic capacitances Cx1, Cx2.

The terminals will be hereinafter referred to as A and B. The terminal A is linked to the ground through the parasitic capacitance Cx1 and the terminal B is linked to the ground through the parasitic capacitance Cx2.

Such an application corresponds for example to the measurement of a capacitance $Cc_{i,j}$ of a touch screen TSD, the capacitances Cx1, Cx2 being in that case line and column parasitic capacitances of the touch screen, as it will be seen below thanks to an example.

A device MD3 is associated to the device MD1. The device MD3 comprises a connection terminal B10, an operational amplifier OP2 and two switches SW10, SW11 driven by signals S10, S11. The positive input of the operational amplifier OP2 receives the voltage Vref. The output of the operational amplifier is sent to the negative input thereof and is linked to the terminal B10 through the switch SW10. The terminal B10 is linked to the ground through the switch SW11.

The terminal A of the capacitance Cc is linked to the terminal B2 of the switch SW6 of the device MD1. The terminal B1 of the switch SW6 is as previously linked to the ground through the reference capacitance Cr. The terminal B of the capacitance Cc is linked to the terminal B10 of the device MD3.

The characterization or measurement of the capacitance Cc comprises two steps E1 and E2.

Step E1: The phases Pcm1/Pcm2/Pcm3 described above are executed by means of the device MD1. When the phase Pcm3 is executed, the switch SW6 is placed in the state ON2 and its terminal B2 is linked to its terminal B0. The voltage V1=Vref is therefore applied to the terminal A of the capacitance Cc. At the same time, the switch SW10 is placed in the state ON and the switch SW11 in the state OFF. The voltage Vref is therefore also applied to the terminal B of the capacitance Cc by the device MD3. The capacitance Cc is therefore neutralized because its terminals A, B receive the same voltage. The device MD1 only sees the parasitic capacitance Cx1 from the input thereof, i.e., the terminal B2 of the switch SW6. The step E1 therefore allows the capacitance Cx1 to be measured.

Step E2: The phases Pcm1/Pcm2/Pcm3 are executed a second time by means of the device MD1. When the phase Pcm3 is executed, the switch SW6 is placed in the state ON2 and its terminal B2 is linked to its terminal B0. The voltage V1=Vref is therefore applied to the terminal A of the capacitance Cc. The switch SW11 is previously placed in the state ON and the switch SW10 in the state OFF. The terminal B of the capacitance Cc is therefore linked to the ground by the device MD3.

Thus, the device MD1 sees from its input the parasitic capacitance Cx1 in parallel with the capacitance Cc. The capacitance Cx2 is neutralized because the two terminals thereof are linked to the ground. The step E2 therefore allows a capacitance equal to Cc+Cx1 to be measured.

At the end of the steps E1, E2, the device MD1 knows the capacitances Cc+Cx1 and Cx1, it deduces therefrom the capacitance Cc by simple subtraction of the two measurement results:

$$Cc = -Cx1 \quad (19)$$

Such a measurement of floating capacitance by means of the device MD1 reaches its limits when the capacitance Cc is very low in relation to the parasitic capacitance Cx1. In that case, an error in the measurement of Cc+Cx1 and Cx1, may cause a significant error in the measurement of Cc, in particular if the measurement error is of the same order of magnitude as the capacitance Cc.

Second Aspect of the Disclosure

Figure 5:
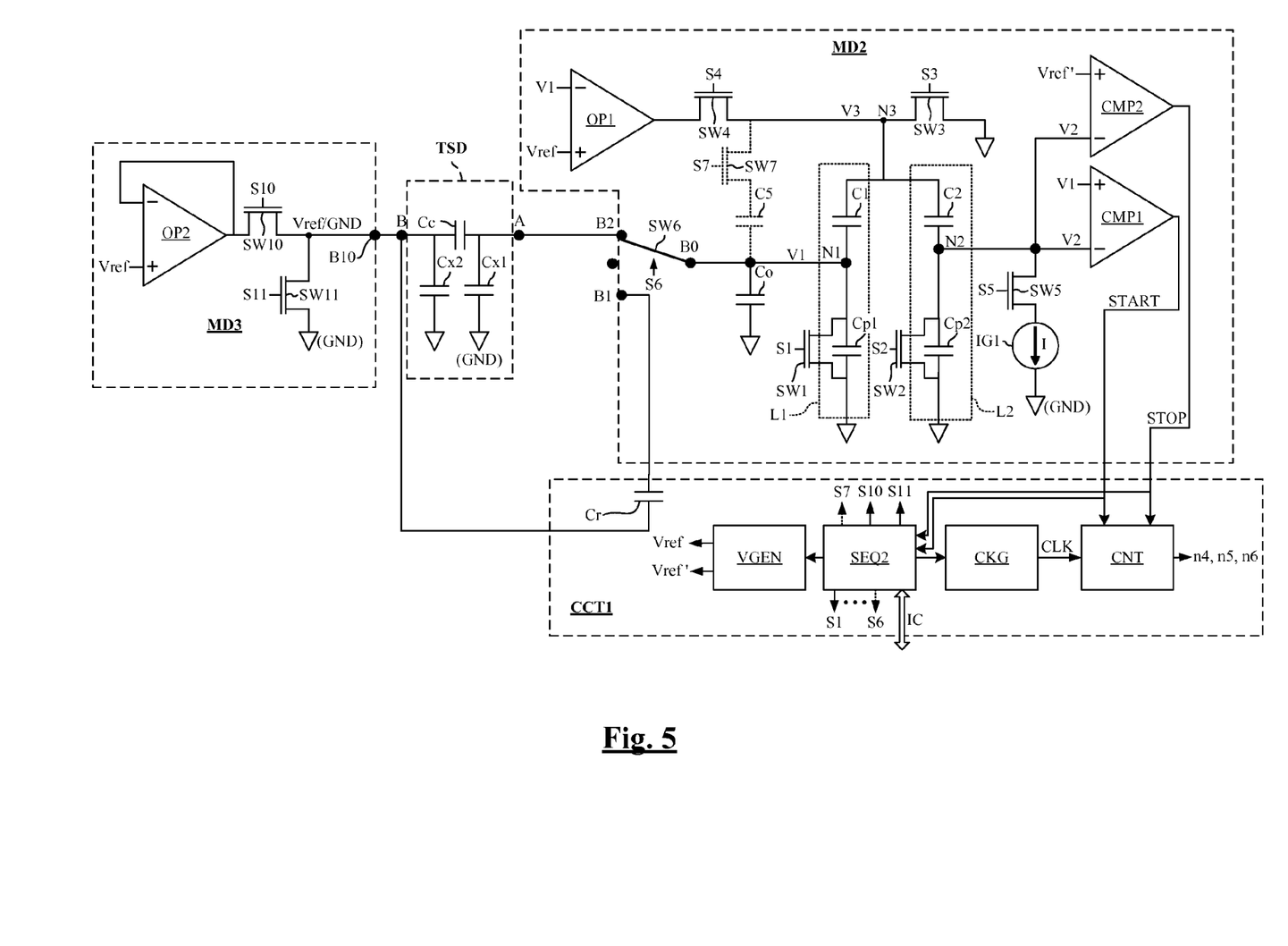
FIG. 5 shows a characterization and measurement device according to a second aspect of the disclosure.

FIG. 5 shows a characterization and measurement device MD2 adapted to the implementation of the method according to the second aspect of the disclosure. The device MD2 is associated to the device MD3 described above, which structure is not modified.

The device MD2 comprises various elements of the device MD1, i.e.:

the capacitive divider bridge L1 arranged between the node N3 and the ground, comprising the capacitance C1 between the node N3 and the node N1 and the capacitance Cp1 between the node N1 and the ground, the capacitive divider bridge L2 arranged between the node N3 and the ground, comprising the capacitance C2 between the node N3 and the node N2 and the capacitance Cp1 between the node N2 and the ground, the offset capacitance Co, between the node N1 and the ground, the switches SW1, SW2, SW3, SW4, SW5, SW6, arranged as previously described, the operational amplifier OP1, receiving the voltage V1 of the node N1 on the negative input thereof and the voltage Vref on the positive input thereof, and supplying the voltage V3 of the node N3 when the switch SW4 is conductive, the voltage generator VGEN, supplying the voltage Vref, the comparator CMP1, receiving the voltage V1 on a positive input thereof and the voltage V2 on the negative input thereof, the current generator IG1, arranged in series with the switch SW5 between the node N2 and the ground, the clock signal generator CKG, the counter CNT, receiving the clock signal CLK.

The device MD2 also comprises a wired-logic or microprocessor sequencer SEQ2, equipped with a communication interface IC. The sequencer supplies the signals S1 to S6 for controlling the switches SW1 to SW6 as well as signals S10, S11 for controlling switches of the device MD3.

The device MD2 also comprises a second comparator CMP2, which receives on the negative input thereof the voltage V2 of the node N2 and on the negative input thereof a voltage Vref' lower than the voltage Vref or substantially equal by lower values to the voltage Vref. The voltage Vref' is supplied here by the generator VGEN but may also be obtained by simple division of the voltage Vref.

The signal START applied to the counter CNT is here supplied by the output of the comparator CMP1 instead of being supplied by the sequencer. The signal STOP is supplied by the output of the comparator CMP2 instead of being supplied by the comparator CMP1. The signals START and STOP are like previously, applied to the counter CNT. They are also applied to the sequencer SEQ2 so that it is informed of the beginning and the end of a measurement step described below.

The control elements such as the generator VGEN, the sequencer SEQ2, the clock signal generator CKG and the counter CNT, are here arranged in a control circuit CCT1 shown in the form of a block different from the device MD2 but which may be considered as integral thereto. The sequencer SEQ2 supplies here, in addition to the signals S1 to S6 for controlling the switches SW1 to SW6, the signals S10, S11 for controlling the switches SW10, SW11 of the device MD3.

The capacitance Cc to be characterized or measured is identical to that shown in FIG. 4 and comprises the parasitic capacitances Cx1, Cx2 respectively linking its terminal A to the ground and its terminal B to the ground. The terminal A is linked to the terminal B2 of the switch SW6 of the device MD2 and the terminal B is linked to the terminal B10 of the device MD3.

The terminal B1 of the switch SW6 is as previously linked to a terminal of the reference capacitance Cr. The other terminal of the capacitance, instead of being connected to the ground, is here linked to the terminal B10 of the device MD3.

As previously, the capacitance C1 is assumed to be equal to the capacitance C2 and the capacitance Cp1 is assumed to be equal to the capacitance Cp2. The capacitance Co is considered as the cause of the unbalance between the divider bridges L1, L2 when the capacitances Cr or Cc are not connected to the device MD2.

Implementation of the Method

In one embodiment, the method for characterizing or measuring a capacitance according to the second aspect of the disclosure comprises three phases:

1) an offset measurement phase Pcm4, 2) a phase Pcm5 for calibrating the device MD1 by means of the capacitance Cr, 3) a phase Pcm6 for characterizing or measuring the capacitance Cc.

Each of these three phases comprises a precharge step P1, a predischarge step P2.1, a measurement step P2.2, and a step P3 for resetting the device.

Figure 6A:
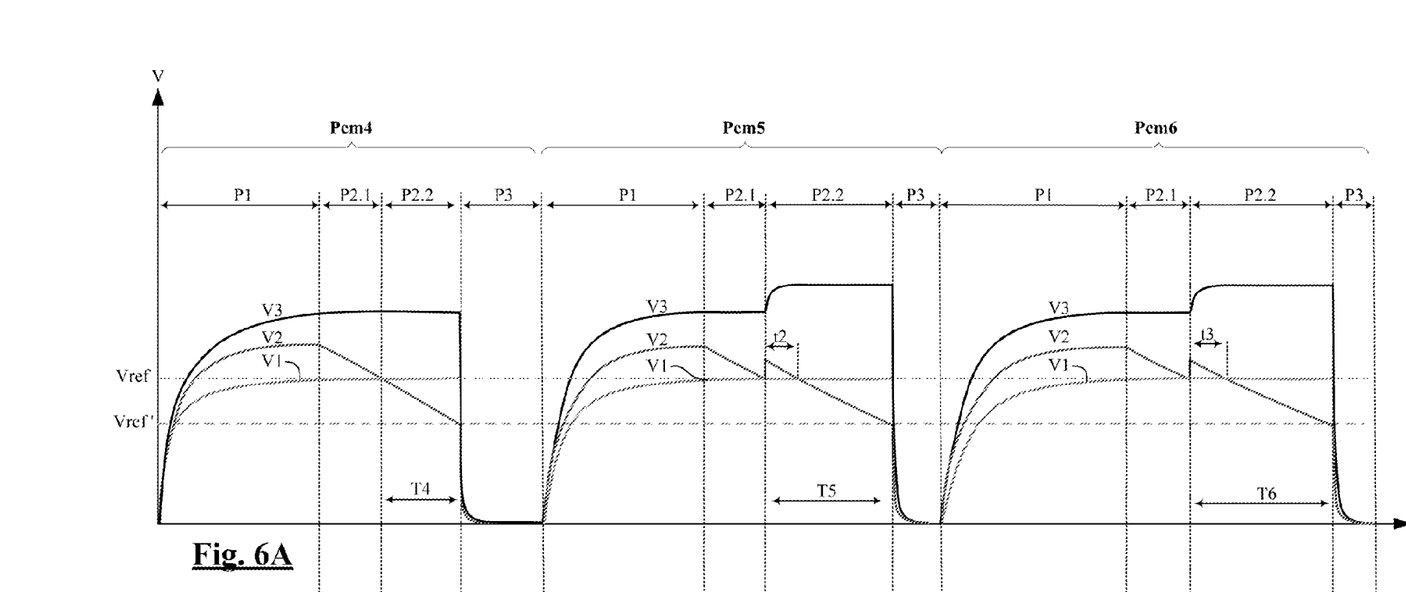
FIGS. 6A, 6B show electrical signals in the device of FIG. 5 according to one embodiment of a second method according to the disclosure.
Figure 6B:
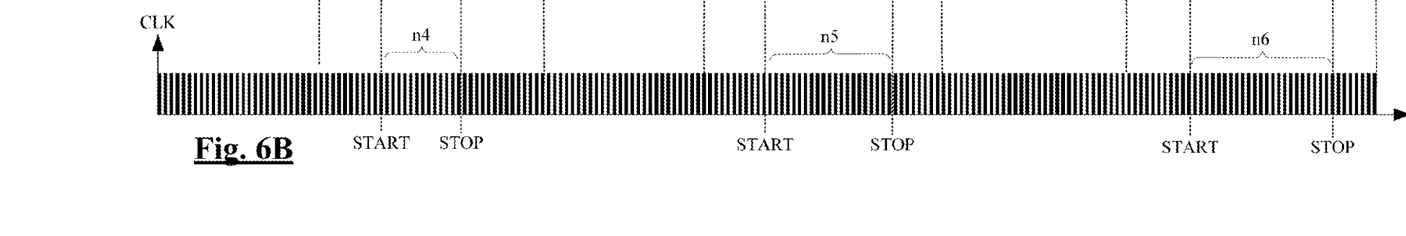

FIG. 6A shows the curves of the voltages V1, V2 and V3 during each of the phases Pcm4, Pcm5, Pcm6. FIG. 6B shows the clock signal CLK supplied by the generator CKG as well as counting values n4, n5, n6 supplied by the counter CNT.

The following Table 3 sums-up the states of the switches during the different steps of these various phases.

TABLE 3

| Phase | Step | SW1 | SW2 | SW3 | SW4 | SW5 | SW6 | SW10 | SW11 |
|-------|------|-----|-----|-----|-----|-----|-----|------|------|
| Pcm4  | P1   | OFF | OFF | OFF | ON  | OFF | OFF | —    | —    |
|       | P2.1 | OFF | OFF | OFF | ON  | ON  | OFF | —    | —    |
|       | P2.2 | OFF | OFF | OFF | ON  | ON  | OFF | —    | —    |
|       | P3   | ON  | ON  | ON  | OFF | OFF | OFF | —    | —    |
| Pcm5  | P1   | OFF | OFF | OFF | ON  | OFF | ON1 | ON   | OFF  |
|       | P2.1 | OFF | OFF | OFF | ON  | ON  | ON1 | ON   | OFF  |
|       | P2.2 | OFF | OFF | OFF | ON  | ON  | ON1 | OFF  | ON   |
|       | P3   | ON  | ON  | ON  | OFF | OFF | ON1 | OFF  | ON   |
| Pcm6  | P1   | OFF | OFF | OFF | ON  | OFF | ON2 | ON   | OFF  |
|       | P2.1 | OFF | OFF | OFF | ON  | ON  | ON2 | ON   | OFF  |
|       | P2.2 | OFF | OFF | OFF | ON  | ON  | ON2 | OFF  | ON   |
|       | P3   | ON  | ON  | ON  | OFF | OFF | ON2 | OFF  | ON   |

1) Offset Measurement Phase Pcm4 i) Precharge Step P1

The sequencer SEQ2 places the switches SW1, SW2, SW3, SW5, SW6 in the state OFF and the switch SW4 in the state ON. The amplifier OP1 controls the voltage V3 of the node N3 and the voltage V1 of the node N1 tends to the voltage Vref by feedback effect.

At the end of the precharge phase, the voltage V2 at the node N2 reaches a value V2(1) higher than the voltage V1 for the reasons mentioned above.

ii) Predischarge Step P2.1

The sequencer SEQ2 places the switch SW5 in the state ON, does not modify the state of the other switches. The node N2 is discharged by the current I and the voltage V2 decreases, while the voltage V1 keeps being maintained near Vref by the amplifier OP1.

iii) Measurement Step P2.2

The measurement step is triggered by the comparator CMP1 when the voltage V2 starts becoming lower than the voltage V1, i.e., the voltage Vref. The signal START goes to 1 at the output of the comparator CMP1 and activates the counter CNT. The measurement step ends when the voltage V2 starts becoming lower than the voltage Vref'. The signal STOP goes to 1 at the output of the comparator CMP2 and stops the counter CNT.

This step allows an electric charge Q4 for the voltage V2 to go from Vref to Vref' to be measured. The counter CNT supplies a counting value n4 which is proportional to the duration T4 of the measurement step, such as T4=K*n4, where K is the period of the clock signal. The parameter n4 is memorized by the sequencer.

iv) Reset Step P3

The sequencer places the switches SW1, SW2, SW3 in the state ON and the other switches in the state OFF. The capacitances C1, C2, Cp1, Cp2, Co are discharged.

2) Calibration Phase Pcm5 i) Precharge Step P1

The sequencer SEQ2 places the switches SW1, SW2, SW3, SW5 in the state OFF, the switch SW4 in the state ON and the switch SW6 in the state ON1. The terminal B1 of switch SW6 is linked to the terminal B0. The proximal terminal of the capacitance Cr, connected to the terminal B1 of the switch SW6, receives the voltage V1. The sequencer also places the switch SW10 in the state ON, and the switch SW11 in the state OFF, so that the distal terminal of the capacitance Cr receives the voltage Vref.

The output of the amplifier OP1 controls the voltage V3 of the node N3 through the switch SW4 and the voltage V1 of the node N1 tends to the voltage Vref by feedback effect. When the voltage Vref is reached or nearly reached by the voltage V1, the capacitance Cr is discharged or nearly discharged because it receives the voltage Vref on the two terminals thereof. At the end of the precharge phase, the voltage V2 at the node N2 reaches a value V2(2) higher than the voltage V1.

ii) Predischarge Step P2.1

The sequencer SEQ2 places the switch SW5 in the state ON, does not modify the state of the other switches. The node N2 is discharged by the current I and the voltage V2 decreases, while the voltage V1 keeps being maintained near Vref by the amplifier OP1.

iii) Measurement Step P2.2

The measurement step is triggered by the comparator CMP1 when the voltage V2 starts becoming lower than the voltage V1, i.e., the voltage Vref. The signal START goes to 1 at the output of the comparator CMP1 and activates the counter CNT. The sequencer SEQ2, which also receives the signal START, places the switch SW10 in the state OFF and the switch SW11 in the state ON, and lets the switches SW4, SW5 in the state ON. The capacitance Cr sees the voltage on its proximal terminal go from Vref to 0 and discharges. This charge causes an additional unbalance between the divider bridges L1, L2 and a sudden increase of the voltage V2, while the voltage V1 keeps being maintained near Vref by the amplifier OP2. Then, the voltage V2 starts decreasing again toward Vref' passing a second time by Vref.

After the leap of the voltage V2, the signal START goes to zero again and goes a second time to 1 when the voltage V2 starts becoming lower than the voltage V1 again. The counter CNT is however configured to take into account only the first time the signal START goes to 1, and goes on counting the clock cycles as long as the signal STOP does not go to 1. Thus, the counting period spreads over the whole measurement step P2.2.

The measurement step ends when the voltage V2 starts becoming lower than the voltage Vref'. The signal STOP goes to 1 at the output of the comparator CMP1 and stops the counter CNT.

This step makes it possible to measure an electric charge Q5 to bring the voltage V2 from the value Vref to the value Vref' taking into account the introduction of the capacitance Cr at the time when the voltages V1, V2 reach a balance. The counter CNT supplies a counting value n5 which is proportional to the duration T5 of the measurement step. The parameter n5 is memorized by the sequencer.

iv) Reset Step P3

The sequencer places the switches SW1, SW2, SW3 in the state ON and the other switches in the state OFF. The capacitances C1, C2, Cp1, Cp2, Co are discharged. The switches SW6, SW11 may optionally be let in the state ON1, respectively ON, so as to discharge the capacitance Cr.

3) Characterization or Measurement Phase Pcm6 i) Precharge Step P1

The sequencer SEQ2 places the switches SW1, SW2, SW3, SW5 in the state OFF, the switch SW4 in the state ON and the switch SW6 in the state ON2. The terminal A of the capacitance Cc, connected to the terminal B2 of the switch SW6, receives the voltage V1. The sequencer also places the switch SW10 in the state ON, and the switch SW11 in the state OFF. The terminal B of the capacitance Cc receives the voltage Vref.

The voltage V1 tends to the voltage Vref. When the voltage Vref is reached or nearly reached by the voltage V1, the capacitance Cc is discharged or nearly discharged because it receives the voltage Vref on the two terminals A, B thereof. The parasitic capacitance Cx1 is however charged. At the end of the precharge phase, the voltage V2 at the node N2 reaches a value V2(3) higher than the voltage V1.

ii) Predischarge Step P2.1

The sequencer SEQ2 places the switch SW5 in the state ON, does not modify the state of the other switches. The current I makes the voltage V2 decrease, while the voltage V1 stays near Vref.

iii) Measurement Step P2.2

The measurement step is triggered by the comparator CMP1 when the voltage V2 starts becoming lower than the voltage V1, i.e., Vref. The signal START then goes to 1 and activates the counter CNT. The sequencer SEQ2 places the switch SW10 in the state OFF and the switch SW11 in the state ON, and lets the switches SW4, SW5 in the state ON. The capacitance Cc sees the voltage on its terminal B go from Vref to 0 and discharges. This charge causes an additional unbalance between the divider bridges L1, L2 and a sudden increase of the voltage V2, while the voltage V1 remains maintained near Vref by the amplifier OP2. Then, the voltage V2 starts decreasing again toward Vref' passing a second time by Vref.

The measurement step ends when the voltage V2 starts becoming lower than the voltage Vref'. The signal STOP goes to 1 at the output of the comparator CMP1 and stops the counter CNT.

This step makes it possible to measure an electric charge Q6 to bring the voltage V2 from the value Vref to the value Vref' taking into account the introduction of the capacitance Cc at the time when the voltages V1, V2 reach a balance. The counter CNT supplies a counting value n6 which is proportional to the duration T6 of the measurement step. The parameter n6 is memorized by the sequencer.

iv) Reset Step P3

The sequencer places the switches SW1, SW2, SW3 in the state ON and the other switches in the state OFF. The capacitances C1, C2, Cp1, Cp2, Co are discharged. The switches SW6, SW11 may optionally be let in the state ON2, respectively ON, so as to discharge the capacitance Cc.

Using the Characterization or Measurement Data

As previously indicated, it is considered that C1=C2 and Cp1=Cp2 and that the unbalance of the two divider bridges L1, L2 is caused by the offset capacitance Co.

In these conditions, the electric charge Q4 measured during the measurement step P2.2 of the phase Pcm4, so that the voltage V2 goes from the balance point where V2=V1=Vref to the point where V2=Vref', only depends on the current I and the global capacitance seen from the node N2. During the measurement step P2.2 of the phase Pcm5, the electric charge measured so that the voltage V2 goes from V1=Vref to Vref' would only depend on the global capacitance seen from the node N2 if a voltage variation was not suddenly applied to the capacitance Cr. In this case, the duration T5 of the measurement step P2.2 of the phase Pcm5 would be equal to the duration T4 of the measurement step P2.2 of the phase Pcm4. The voltage variation applied to the capacitance Cr shifts the decreasing curve of the voltage V2 and adds to the decreasing time T4 a time t2 shown in FIG. 6A. The time t2, equal to the difference between T5 and T4, corresponds to the electric charge to charge the capacitance Cr under the voltage V1=Vref. It may therefore be written:

$$Cr*V1=I*(T5-T4) \qquad (20)$$

The same reasoning applies to the phase Pcm6, where the voltage variation applied to the capacitance Cc creates a delay t3 equal to T6-T4 in the decreasing of the voltage V2, and it may be written:

$$Cc*V1=I*(T6-T4) \qquad (20)$$

By combining and:

$$Cc=Cr/(T5-T4) \qquad (22)$$

i.e.:

$$Cc=Cr/(n5-n4) \qquad (23)$$

The relationship allows Cc to be measured as a function of Cr and is equivalent to the relationship. However, the conditions in which this relationship is implemented differ from those in which the relationship is implemented, because the device MD2 combined to the device MD3 allows a floating measurement of the capacitance Cc while avoiding the parasitic capacitance Cx1 which links the terminal A of the capacitance Cc to the ground.

In other embodiments, the voltage variation on the terminal B of the capacitance Cc may be chosen lower than Vref. The terminal B may for example go from Vref to Vref/2 or from Vref/2 to 0. In that case, the relationship becomes:

$$Cr*V1/2=I*(T5-T4) \qquad (20')$$

The voltage variation applied to the terminal B may also be higher than Vref, to increase the measurement sensitivity.

Like the device MD1, the device MD2 may be used to characterize the capacitance Cc without knowing the capacitance Cr, i.e., following the variations of Cc. It may also be linked to an external calculation means which uses the characterization data to determine the precise values of the capacitance Cc from an initial value Cc0 which is assumed to be known.

It will be clear to those skilled in the art that the embodiments previously described of the devices MD1, MD2 and MD3 are susceptible of various embodiments. The components used such as the operational amplifier OP1, the comparators CMP1, CMP2, the switches SW1-SW6, SW10, SW11, the counter CNT, may be replaced by equivalent means.

In a variation of the device MD2, a capacitance C5 is added in series with a switch SW7 between the node N3 and the node N1. The switch SW7 is placed in the state ON during the precharge phase and allows the node N1 to increase to the voltage V1 with a value of the voltage V3 which is not very high. The switch SW7 is then placed back in the state OFF during the steps P2.1, P2.2 and P3. This capacitance C5 also makes it possible to give a low value to the capacitance C1 while keeping a high equivalent capacitance C1'=C1+C5 during the precharge step. Using a capacitance C1 of low value allows the device sensitivity to be increased during the measurement of a capacitance Cc of low value, the capacitance C1 must preferably be of the same order of magnitude as the capacitance to be measured Cc, or lower than it. The increase of the device sensitivity results in an increase in the amplitude of the leap of the voltage V2 at the time where the step P2.2 starts, and an increase of the times T5 and T6.

In another embodiment of the device MD5, the voltage Vref' is equal to Vref. In that case, the phase Pcm4 may be suppressed because the time T4 becomes equal to 0. The measurement step P2.2 of the phase Pcm5 then consists in measuring the time t2 and the measurement step P2.2 of the phase Pcm6 in measuring the time t3. Choosing a counting stop voltage Vref' different from the voltage Vref is justified for purely practical reasons, so that the times T5 and T6 are long enough in relation to the switching time of the elements which allow them to be measured, or in relation to the period of the clock signal. Indeed, the acquisition time of the characterization parameters n1, n2, n3 or n4, n5, n6 according to the is very short and much lower than the acquisition time imposed by the conventional methods for measuring or characterizing a capacitance.

Example Application

Figure 7:
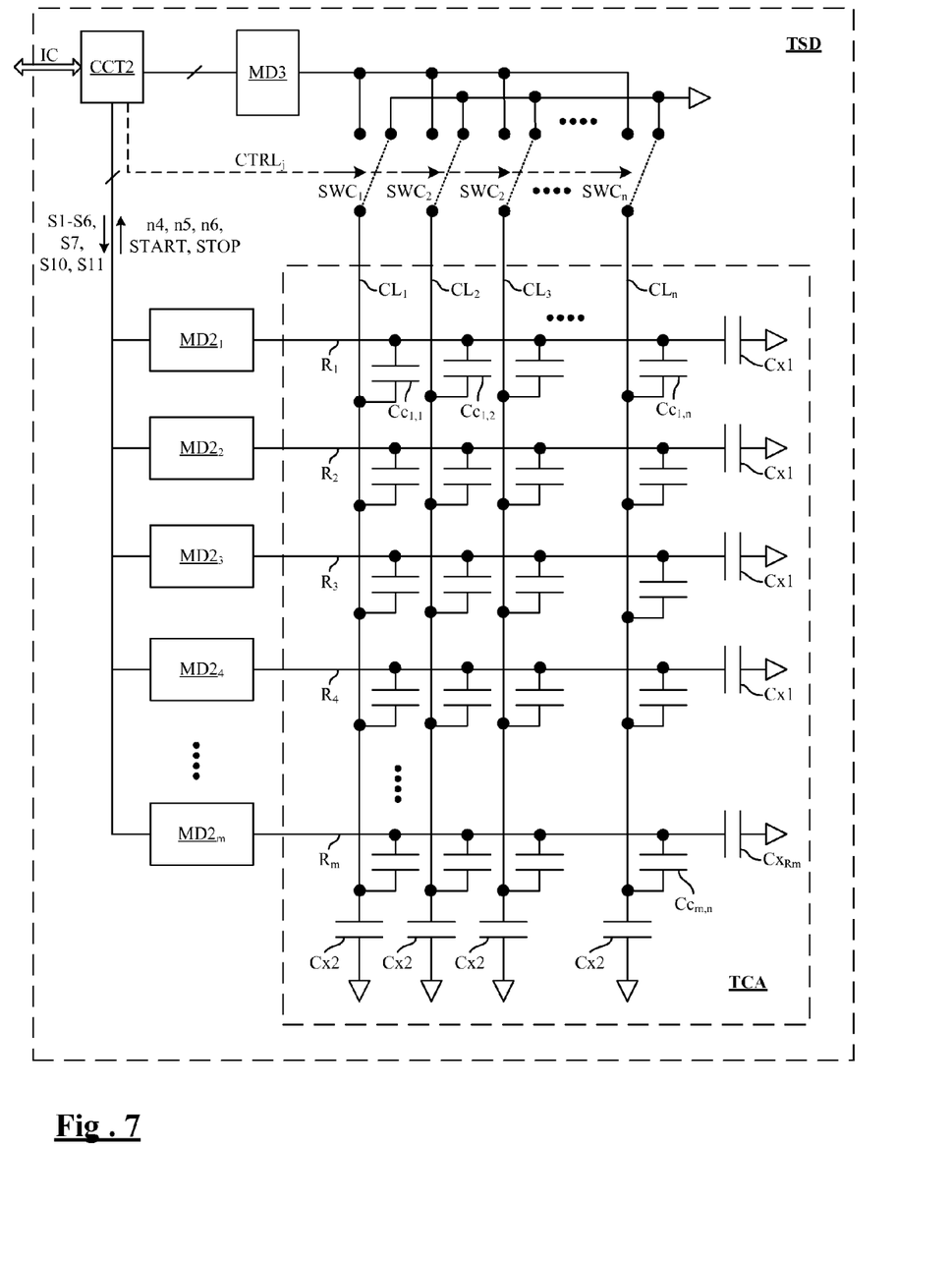
FIG. 7 shows an application of the device of FIG. 5 to the control of a touch screen display device.

FIG. 7 schematically shows a tactile device TSD, for example a touch screen display, comprising a tactile capacitance matrix TCA and a device according to the disclosure for measuring or characterizing matrix capacitances TCA.

The matrix TCA comprises tactile capacitances $Cc_{i,j}$ each connected to a line $R_i$ and a column $CL_j$. Each line Ri linked to the ground through a parasitic capacitance Cx1 and each column CLj is linked to the ground through a parasitic capacitance Cx2.

The tactile device TSD comprises a plurality of devices MD2, each device MD2, being connected to a line $R_i$ of corresponding rank i, and of same structure as the device MD2 previously described. The device TSD also comprises a device MD3 such as previously described, switches $SWC_j$ and a control circuit CCT2. Each switch $SWC_j$ is arranged between the device MD3 and one of the columns $CL_j$ of corresponding rank j and is controlled by signals $CTRL_j$ supplied by the circuit CCT2. The structure of the circuit CCT2 is of the type of that of the circuit CCT1 described with reference to FIG. 5, the sequencer SEQ2 being configured to selectively apply to each of the devices MD2, the control signals S1-S6, S10, S11, optionally S7, and selectively receive from each of the devices MD2, the characterization or measurement parameters n4, n5, n6 and the signals START, STOP. The reference capacitance Cr is for example arranged inside the device CCT2.

The connection between the device CCT2 and the devices $MD2_i$ is preferably made by means of electrical conductors arranged in parallel, so that the devices MD2, may simultaneously apply the phases Pcm4, Pcm5, Pcm6 to the capacitances connected to a same column $CL_j$, and send back in real time to the control circuit CCT2 the characterization or measurement parameters n4, n5, n6 of each of these capacitances. To that end, the device CCT2 places one of the switches $SWC_j$ in the state ON and simultaneously activates the devices $MD2_i$, executes the phases Pcm4, Pcm5, Pcm6 for each capacitance $Cc_{i,j}$ connected to the corresponding column $CL_j$, by means of each device $MD2_i$, memorizes the parameters n4, n5, n6 sent back by each device MD2, and associates them to the capacitance $Cc_{i,j}$ concerned, and places the switch $SWC_j$ back in the state OFF and places the following switch $SWC_{j+1}$ in the state ON, and so on until all the capacitances are read, and starts again the process of reading the capacitances and so forth.

A user's action on the device TSD is detected as a variation of one or more capacitances Cci,j. The data n4, n5, n6 for characterizing each capacitance, which are cyclically refreshed at each new matrix scan, are sent to an external processor which starts actions as a function of the variations of these capacitances. Alternately, the control device CCT2 calculates the values of the capacitances using the relationship described above, and sends back to the external processor capacitance values.

It will be clear to those skilled in the art that embodiments of the method and device for characterizing or measuring capacitances according to the disclosure are susceptible of various other applications such as the measurement of capacitances in an antenna circuit of contactless integrated circuit, for example to implement an automatic agreement process of the antenna, the control of capacitive control switches, the integration of capacitance measurement means into a built-in test device embedded into an integrated circuit, etc.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for characterizing or measuring a first capacitance, comprising:
    electrically coupling a first terminal of the first capacitance to a first mid-point of a first capacitive voltage divider bridge that is in parallel with a second capacitive voltage divider bridge, the second capacitive voltage divider bridge comprising a second mid-point, the first mid-point having a first voltage and the second mid-point having a second voltage,
    applying to the divider bridges a bias voltage,
    maintaining the first voltage near a reference voltage,
    discharging the second mid-point with a constant current, and
    measuring a first time for the second voltage to reach a voltage threshold.

2. A method according to claim 1, wherein the voltage threshold is equal to the first voltage.

3. A method according to claim 1, comprising an offset measurement phase that includes:
    electrically decoupling the first capacitance from the first mid-point,
    applying to the divider bridges the bias voltage,
    maintaining the first voltage near the reference voltage,
    discharging the second mid-point with a constant current, and
    measuring a second time for the second voltage to become equal to the first voltage.

4. A method according to claim 3, comprising calculating a difference between the first and the second times, as a characterization or measurement parameter of the first capacitance.

5. A method according to claim 3, comprising a calibration phase that includes:
- electrically coupling a calibration capacitance to the first mid-point,
- applying to the divider bridges the bias voltage,
- maintaining the first voltage near the reference voltage,
- discharging the second mid-point with a constant current, and
- measuring a third time for the second voltage to become equal to the first voltage.

6. A method according to claim 5, comprising calculating a capacitance of the first capacitance including calculating a product of the calibration capacitance and a ratio of a difference between the first and the second times and a difference between the third and the second times.

7. A method according to claim 1, wherein measuring the first time includes counting a number of cycles of a clock signal.

8. A device, comprising:
- a first capacitive voltage divider bridge and a second capacitive voltage divider bridge in parallel with the first capacitive voltage divider bridge, the first capacitive voltage divider bridge having a first mid-point, and the second capacitive voltage divider bridge having a second mid-point,
- means for electrically coupling a first capacitance to the first mid-point,
- means for applying to the divider bridges a bias voltage and maintaining a first voltage of the first mid-point near a reference voltage,
- means for discharging the second mid-point with a constant current, and
- means for measuring a first time for a second voltage at the second mid-point to reach a voltage threshold.

9. A device according to claim 8, wherein the voltage threshold is equal to the first voltage.

10. A device according to claim 8, comprising means for executing an offset measurement phase that includes:
- electrically decoupling the first capacitance from the first mid-point,
- applying to the divider bridges the bias voltage,
- maintaining the first voltage near the reference voltage,
- discharging the second mid-point with a constant current, and
- measuring a second time for the second voltage to become equal to the first voltage.

11. A device according to claim 10, comprising means for executing a calibration phase that includes:
- electrically coupling a calibration capacitance to the first mid-point,
- applying to the divider bridges the bias voltage,
- maintaining the first voltage near the reference voltage,
- discharging the second mid-point with a constant current, and
- measuring a third time for the second voltage to become equal to the first voltage.

12. A device according to claim 11, comprising a controller configured to determine a capacitance of the first capacitance by calculating a product of a capacitance of the calibration capacitance and a ratio of a difference between the first and the second times and a difference between the third and the second times.

13. A device according to claim 10, comprising a controller configured cause execution of the offset measurement phase followed by plural phases for characterizing or measuring the first capacitance.

14. A device according to claim 8, wherein the means for maintaining the voltage of the first mid-point near the reference voltage comprise a feedback loop including a means for comparing the first voltage to the reference voltage.

15. A device according to claim 8, wherein the means for measuring the first time comprise means for counting a number of cycles of a clock signal.

16. A device, comprising:
- a first capacitive voltage divider bridge and a second capacitive voltage divider bridge in parallel with the first capacitive voltage divider bridge, the first capacitive voltage divider bridge having a first mid-point, and the second capacitive voltage divider bridge having a second mid-point;
- a first capacitance electrically coupled to the first mid-point;
- a bias circuit configured to apply to the divider bridges a bias voltage and maintain a first voltage of the first mid-point near a reference voltage;
- a discharge circuit configured to discharge the second mid-point with a constant current; and
- a measuring circuit configured to measure a first time for a second voltage at the second mid-point to reach a voltage threshold.

17. A device according to claim 16, wherein the measuring circuit includes:
- a comparator having first and second inputs electrically coupled to the first and second mid-points, respectively, and configured to output a stop signal when the second voltage reaches the first voltage; and
- a timer having an input coupled to the output of the comparator and configured to stop timing in response to the stop signal from the comparator.

18. A device according to claim 16, comprising:
- a first switch selectively electrically coupling the first capacitance to the first mid-point; and
- a controller configured to control execution of an offset measurement phase by:
  - causing the first switch to electrically decouple the first capacitance from the first mid-point,
  - cause the first bias circuit to apply the bias voltage to the divider bridges and maintain the first voltage near the reference voltage,
  - cause the discharge circuit to discharge the second mid-point with a constant current, and
  - cause the measuring circuit to measure a second time for the second voltage to become equal to the first voltage.

19. A device according to claim 18, wherein the controller is configured to control execution of a calibration phase by:
- causing the first switch to electrically couple a calibration capacitance to the first mid-point,
- cause the first bias circuit to apply the bias voltage to the divider bridges and maintain the first voltage near the reference voltage,
- cause the discharge circuit to discharge the second mid-point with a constant current, and
- cause the measuring circuit to measure a third time for the second voltage to become equal to the first voltage.

20. A device according to claim 19, wherein the controller is configured to determine a capacitance of the first capacitance by calculating a product of a capacitance of the calibration capacitance and a ratio of a difference between the first and the second times and a difference between the third and the second times.

21. A device according to claim 16, wherein the first bias circuit includes:

an amplifier having first and second inputs and an output, the first input being electrically coupled to the first midpoint of the first capacitive voltage divider bridge, the second input being configured to receive the reference voltage, and the output being selectively electrically coupled to a common terminal of the first and second capacitive voltage divider bridges.

\* \* \* \* \*